(12) United States Patent
Siciliani et al.

(10) Patent No.: US 12,411,770 B2
(45) Date of Patent: *Sep. 9, 2025

(54) HYBRID PARALLEL PROGRAMMING OF SINGLE-LEVEL CELL MEMORY

(71) Applicant: Micron Technology, Inc., Boise, ID (US)

(72) Inventors: Umberto Siciliani, Rubano (IT); Violante Moschiano, Avezzano (IT); Walter Di Francesco, Avezzano (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/649,582

(22) Filed: Apr. 29, 2024

(65) Prior Publication Data

US 2024/0281378 A1 Aug. 22, 2024

Related U.S. Application Data

(63) Continuation of application No. 17/585,165, filed on Jan. 26, 2022, now Pat. No. 12,001,336.

(60) Provisional application No. 63/224,274, filed on Jul. 21, 2021.

(51) Int. Cl.
| | |
|---|---|
| *G06F 12/0842* | (2016.01) |
| *G11C 16/04* | (2006.01) |
| *G11C 16/08* | (2006.01) |
| *G11C 16/10* | (2006.01) |
| *G11C 16/24* | (2006.01) |
| *G11C 16/30* | (2006.01) |
| *G11C 16/34* | (2006.01) |

(52) U.S. Cl.
CPC ...... *G06F 12/0842* (2013.01); *G11C 16/0483* (2013.01); *G11C 16/08* (2013.01); *G11C 16/10* (2013.01); *G11C 16/24* (2013.01); *G11C 16/30* (2013.01); *G11C 16/3459* (2013.01); *G06F 2212/1024* (2013.01)

(58) Field of Classification Search
None
See application file for complete search history.

(56) References Cited

U.S. PATENT DOCUMENTS

| | | | |
|---|---|---|---|
| 2008/0184094 A1 | 7/2008 | Murray et al. | |
| 2008/0209112 A1 | 8/2008 | Yu et al. | |
| 2010/0002503 A1* | 1/2010 | Koebernik | G11C 5/02 365/230.01 |
| 2010/0042772 A1* | 2/2010 | Bonella | G11C 11/5628 711/E12.016 |

(Continued)

*Primary Examiner* — Yaima Rigol
(74) *Attorney, Agent, or Firm* — Lowenstein Sandler LLP

(57) ABSTRACT

A memory device includes a page buffer with multiple registers and a memory array, configured as single-level cell (SLC) memory, including a set of sub-blocks coupled with the page buffer. Control logic is operatively coupled with the page buffer and causes a first page of SLC data to be stored in the multiple registers. The control logic causes a subsequent page of the SLC data to be stored in the multiple registers. The control logic causes the subsequent page and the first page of the SLC data stored in the multiple registers to be concurrently programmed to the set of sub-blocks. The control logic causes at least some of the operations for programming the first page and the subsequent page to the set of sub-blocks to be performed in parallel.

20 Claims, 10 Drawing Sheets

(56) References Cited

U.S. PATENT DOCUMENTS

| | | | |
|---|---|---|---|
| 2011/0029751 A1* | 2/2011 | Nobunaga | G11C 5/025 |
| | | | 711/119 |
| 2011/0080791 A1* | 4/2011 | Kim | G11C 16/24 |
| | | | 365/185.25 |
| 2013/0173847 A1 | 7/2013 | Sprouse et al. | |
| 2013/0258772 A1 | 10/2013 | Lee et al. | |
| 2015/0095551 A1 | 4/2015 | Confalonieri et al. | |
| 2015/0317245 A1* | 11/2015 | Van Keer | H03K 21/403 |
| | | | 711/103 |
| 2016/0049192 A1 | 2/2016 | Lee | |
| 2021/0202015 A1* | 7/2021 | Janjua | H10B 43/27 |

* cited by examiner

HYBRID PARALLEL PROGRAMMING OF SINGLE-LEVEL CELL MEMORY

REFERENCE TO RELATED APPLICATION

This application is a continuation of U.S. patent application Ser. No. 17/585,165, filed Jan. 26, 2022, which claims priority to U.S. Provisional Patent Application No. 63/224,274, filed Jul. 21, 2021, the entirety of each of which is incorporated herein by this reference.

TECHNICAL FIELD

Embodiments of the disclosure relate generally to memory sub-systems, and more specifically, relate to hybrid parallel programming of single-level cell (SLC) memory.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1A:
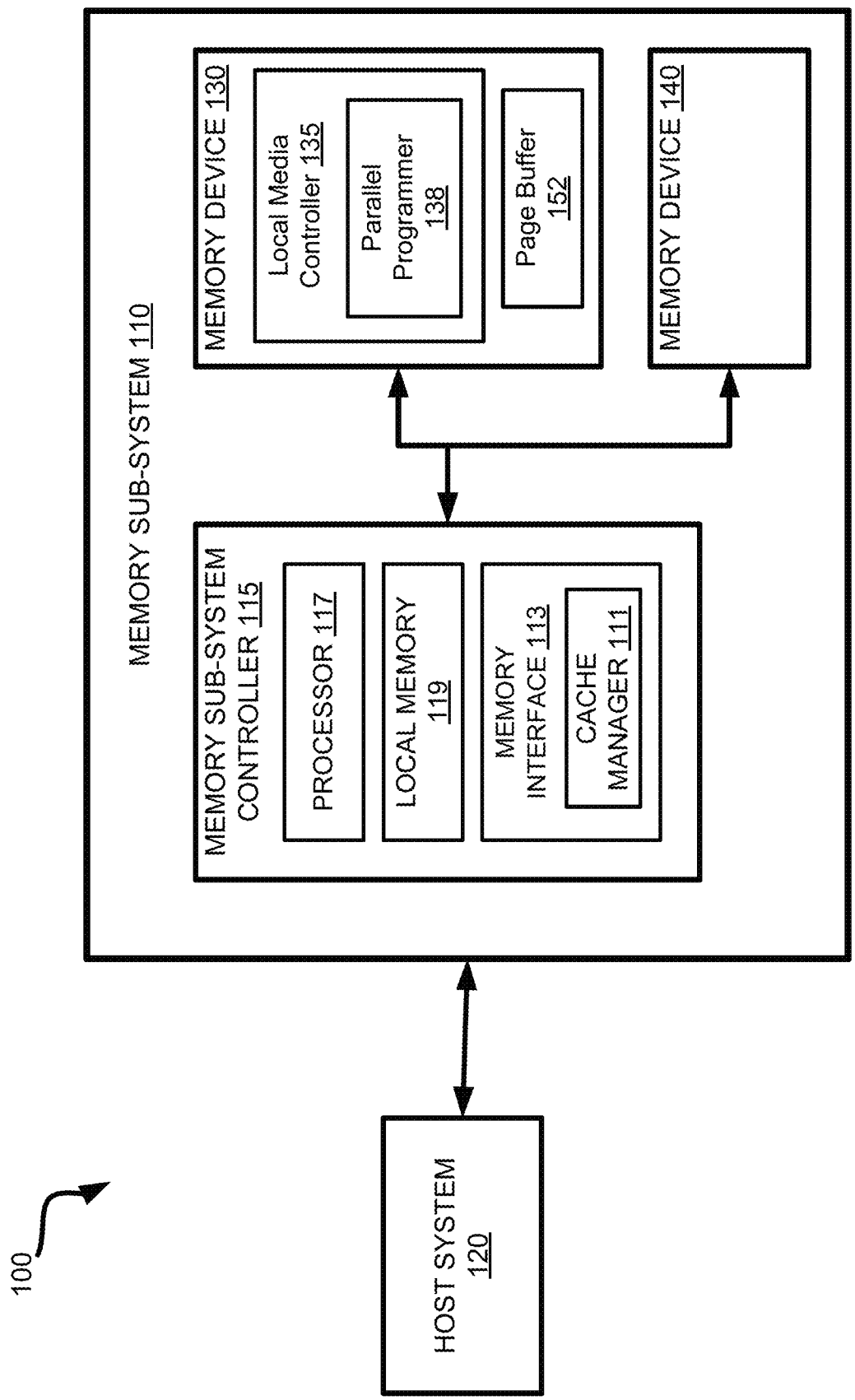
FIG. 1A illustrates an example computing system that includes a memory sub-system in accordance with some embodiments of the present disclosure.

Aspects of the present disclosure are directed to hybrid parallel programming of single-level cell (SLC) memory. In certain memory devices, including non-volatile memory devices such as negative-and (NAND) memory devices, system performance requirements are becoming more aggressive, such as demands for shorter times for programming to (tProg) and reading from (tR) NAND cells of the memory devices. Thus, these memory devices tend to include a portion of the NAND array which can be utilized as SLC cache in which to program SLC data (and from which to read the SLC data) before transferring the SLC data in the SLC cache to multiple-level cell (MLC) memory, such as triple-level cell (TLC) memory, quad-level cell (QLC) memory, or penta-level cell (PLC) memory, which are discussed in more detail with reference to FIG. 1A. The program and read times of SLC memory are faster than those of TLC and much faster than those of high-ordered MLC memory such as QLC and PLC memories. In these memory devices, however, every program cycle utilizes control logic on the memory device to perform the same series of operations to program each SLC page, causing unwanted performance delays as each page is programmed sequentially in turn.

Aspects of the present disclosure address the above and other deficiencies of programming to SLC memory by causing, by a local media controller (e.g., control logic) of the memory device, SLC data for multiple pages to be stored within a cache register and one or more data registers of a page buffer, of the memory device, which is coupled with a set of sub-blocks that are configured as SLC memory. In various embodiments, at least one of the multiple pages of the SLC data is moved from the cache register to a respective data register of the page buffer. In some embodiments, the multiple pages include four pages and three of the four pages are moved to different respective data registers while a fourth page of the four pages remains in the cache register, to set up the capability to perform a hybrid parallel program operation to the set of sub-blocks. In these embodiments, the control logic further causes the SLC data in the cache register and in the one or more data registers to be concurrently programmed to the set of sub-blocks, where a respective page of the multiple pages is to be programmed to each respective sub-block of the set of sub-blocks.

In at least some embodiments, the control logic can then significantly improve programming performance by concurrently causing a subset of the operations for programming the set of sub-blocks from the page buffer to be performed in parallel. As an example, the subset of the operations include causing charge pump initialization to be performed for the set of sub-blocks, causing a program verify initialization to be performed for the set of sub-blocks, and causing bitlines and wordlines to be discharged during a voltage recovery phase. The subset of the operations can also include selecting one or more bitlines not to be involved with programming. Advantages of this approach include, but are not limited to, improved performance in the memory sub-system. In the manner described herein, the performance improvement can be at least a third faster programming time to the SLC memory. When programming times improve, read operations can be completed more quickly. For example, some read operations have to wait for data to be read to be fully programmed to the memory array before the read operation can be completed. These and other advantages apparent to those skilled in the art of memory programming will be discussed in detail below.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such media or memory devices. The memory sub-system 110 can be a storage device, a memory module, or a hybrid of a storage device and memory module.

The memory device 130 can be a non-volatile memory device. One example of non-volatile memory devices is a negative-and (NAND) memory device. A non-volatile memory device is a package of one or more dice. Each die can include one or more planes. Planes can be groups into logic units (LUN). For some types of non-volatile memory devices (e.g., NAND devices), each plane includes a set of physical blocks. Each block includes a set of pages. Each page includes a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1," or combinations of such values.

The memory device 130 can be made up of bits arranged in a two-dimensional or three-dimensional grid, also referred to as a memory array. Memory cells are etched onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface, Open NAND Flash Interface (ONFI) interface, or some other interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which includes a raw memory device 130 having control logic (e.g., local media controller 135) on the die and a controller (e.g., memory sub-system controller 115) for media management within the same memory device package. An example of a managed memory device is a managed NAND (MNAND) device.

In one embodiment, the memory sub-system 110 includes a memory interface component 113, which includes a cache manager 111. The memory interface component 113 is responsible for handling interactions of the memory sub-system controller 115 with the memory devices of memory sub-system 110, such as memory device 130. For example, the memory interface component 113 can send memory access commands corresponding to requests received from the host system 120 to the memory device 130, such as program commands, read commands, or other commands. In addition, the memory interface component 113 can receive data from the memory device 130, such as data retrieved in response to a read command or a confirmation that a program command was successfully performed. In some embodiments, the memory sub-system controller 115 includes at least a portion of the cache manager 111. For example, the memory sub-system controller 115 can include a processor 117 (e.g., a processing device) configured to execute instructions stored in local memory 119 for performing the operations described herein. In some embodiments, the memory interface component 113 is part of the host system 120, an application, or an operating system. In one embodiment, memory interface 113 includes a cache manager 111, among other sub-components. The cache manager 111 can direct memory access commands, such as a read command, a cache read command, a snap read command, a cache read context switch command, or a cache reach context restore command, to memory device 130.

In one embodiment, the local media controller 135 includes a parallel programmer 138 and the memory device 130 includes a page buffer 152 of multiple page buffers that store data temporarily (e.g., buffered) while data is being either programmed to or read from memory cells of the memory device 130. In these embodiments, the parallel programmer 138 can direct programming operations that programs data stored in the page buffer 152 into a set of sub-blocks of an array of SLC memory of the memory device 130. For example, the parallel programmer 138 can cause SLC data for multiple pages to be sequentially stored within the cache register and sequentially moved to a data register of multiple data registers of the page buffer 152 while a page of the multiple pages is retained in the cache register. The parallel programmer 138 can further cause the SLC data stored in a combination of the cache register and the multiple data registers to be concurrently programmed to the set of sub-blocks, where a respective page of the multiple pages is to be programmed to each respective sub-block of the set of sub-blocks. Further, the parallel programmer 138 can cause a subset of the operations for programming the set of sub-blocks to be performed in parallel. Additional details with regards to the operations of the cache manager 111 and parallel programmer 138 are described below.

Figure 1B:
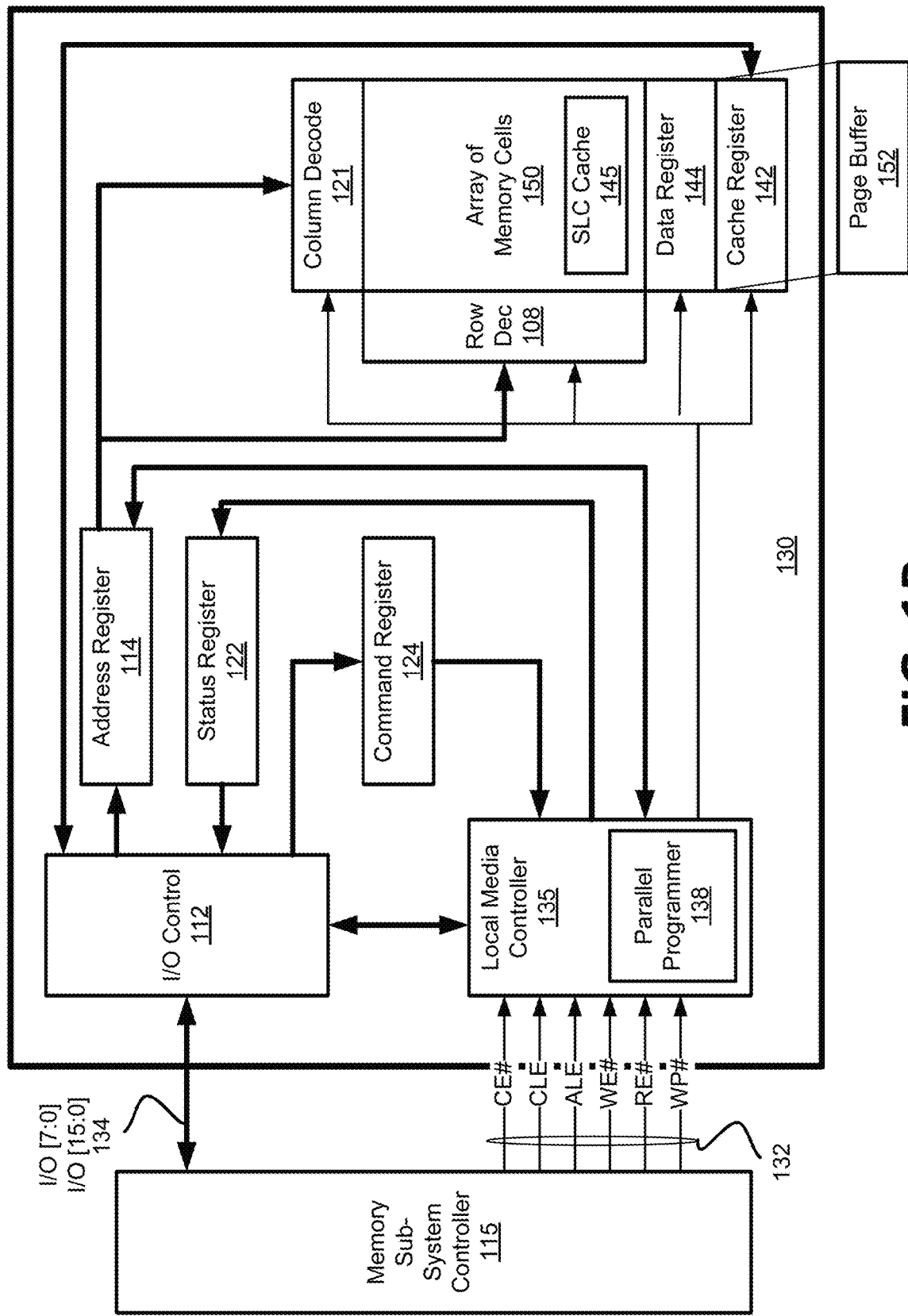
FIG. 1B is a block diagram of a memory device in communication with a memory sub-system controller of a memory sub-system, according to an embodiment.

FIG. 1B is a simplified block diagram of a first apparatus, in the form of a memory device 130, in communication with a second apparatus, in the form of a memory sub-system controller 115 of a memory sub-system (e.g., memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 150 logically arranged in rows and columns. Memory cells of a logical row are typically connected to the same access line (e.g., a word line) while memory cells of a logical column are typically selectively connected to the same data line (e.g., a bitline). A single access line may be associated with more than one logical row of memory cells and a single data line may be associated with more than one logical column. Memory cells (not shown in FIG. 1B) of at least a portion of array of memory cells 150 are capable of being programmed to one of at least two target data states.

In some embodiments, the array of memory cells 150 includes a portion that is SLC cache 145 made up of memory cells configured as SLC memory, e.g., and thus to include the set of sub-blocks to which is referred herein. In some embodiments, the SLC cache 145 is a relatively small percentage of the entire array of memory cells 150, such as between 5 to 15 percent in some embodiments. When the local media controller 135 can direct programming first into the SLC cache 145, the initial programming can be performed more quickly due to the faster performance of programming to SLC memory. The local media controller 135 can then schedule to compress the SLC data with subsequent programming into the rest of the array of memory cells 150 that can include some other MLC memory type.

Row decode circuitry 108 and column decode circuitry 121 are provided to decode address signals. Address signals are received and decoded to access the array of memory cells 150. Memory device 130 also includes input/output (I/O) control circuitry 112 to manage input of commands, addresses and data to the memory device 130 as well as output of data and status information from the memory device 130. An address register 114 is in communication with I/O control circuitry 112 and row decode circuitry 108 and column decode circuitry 121 to latch the address signals prior to decoding. A command register 124 is in communication with I/O control circuitry 112 and local media controller 135 to latch incoming commands.

A controller (e.g., the local media controller 135 internal to the memory device 130) controls access to the array of memory cells 150 in response to the commands and generates status information for the external memory sub-system controller 115, i.e., the local media controller 135 is configured to perform access operations (e.g., read operations, programming operations and/or erase operations) on the array of memory cells 150. The local media controller 135 is in communication with row decode circuitry 108 and column decode circuitry 121 to control the row decode circuitry 108 and column decode circuitry 121 in response to the addresses. In one embodiment, local media controller 135 includes the parallel programmer 138, which can implement the hybrid parallel program of SLC memory of the memory device 130, as described herein.

The local media controller 135 is also in communication with a cache register 142. Cache register 142 latches data, either incoming or outgoing, as directed by the local media controller 135 to temporarily store data while the array of memory cells 150 is busy writing or reading, respectively, other data. During a program operation (e.g., write operation), data may be passed from the cache register 142 to the data register 144 for transfer to the array of memory cells 150; then new data may be latched in the cache register 142 from the I/O control circuitry 112. During a read operation, data may be passed from the cache register 142 to the I/O control circuitry 112 for output to the memory sub-system controller 115; then new data may be passed from the data register 144 to the cache register 142. The cache register 142 and/or the data register 144 may form (e.g., may form a portion of) a page buffer 152 of the memory device 130. The page buffer 152 may further include sensing devices (not shown in FIG. 1B) to sense a data state of a memory cell of the array of memory cells 150, e.g., by sensing a state of a data line connected to that memory cell. A status register 122 may be in communication with I/O control circuitry 112 and the local media controller 135 to latch the status information for output to the memory sub-system controller 115.

Memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 134 and outputs data to the memory sub-system controller 115 over I/O bus 134.

For example, the commands may be received over input/output (I/O) pins [7:0] of I/O bus 134 at I/O control circuitry 112 and may then be written into command register 124. The addresses may be received over input/output (I/O) pins [7:0] of I/O bus 134 at I/O control circuitry 112 and may then be written into address register 114. The data may be received over input/output (I/O) pins [7:0] for an 8-bit device or input/output (I/O) pins [15:0] for a 16-bit device at I/O control circuitry 112 and then may be written into cache register 142. The data may be subsequently written into data register 144 for programming the array of memory cells 150.

In an embodiment, cache register 142 may be omitted, and the data may be written directly into data register 144. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 1B has been simplified. It should be recognized that the functionality of the various block components described with reference to FIG. 1B may not necessarily be segregated to distinct components or component portions of an integrated circuit device. For example, a single component or component portion of an integrated circuit device could be adapted to perform the functionality of more than one block component of FIG. 1B. Alternatively, one or more components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/O pins (or other I/O node structures) may be used in the various embodiments.

Figure 2:
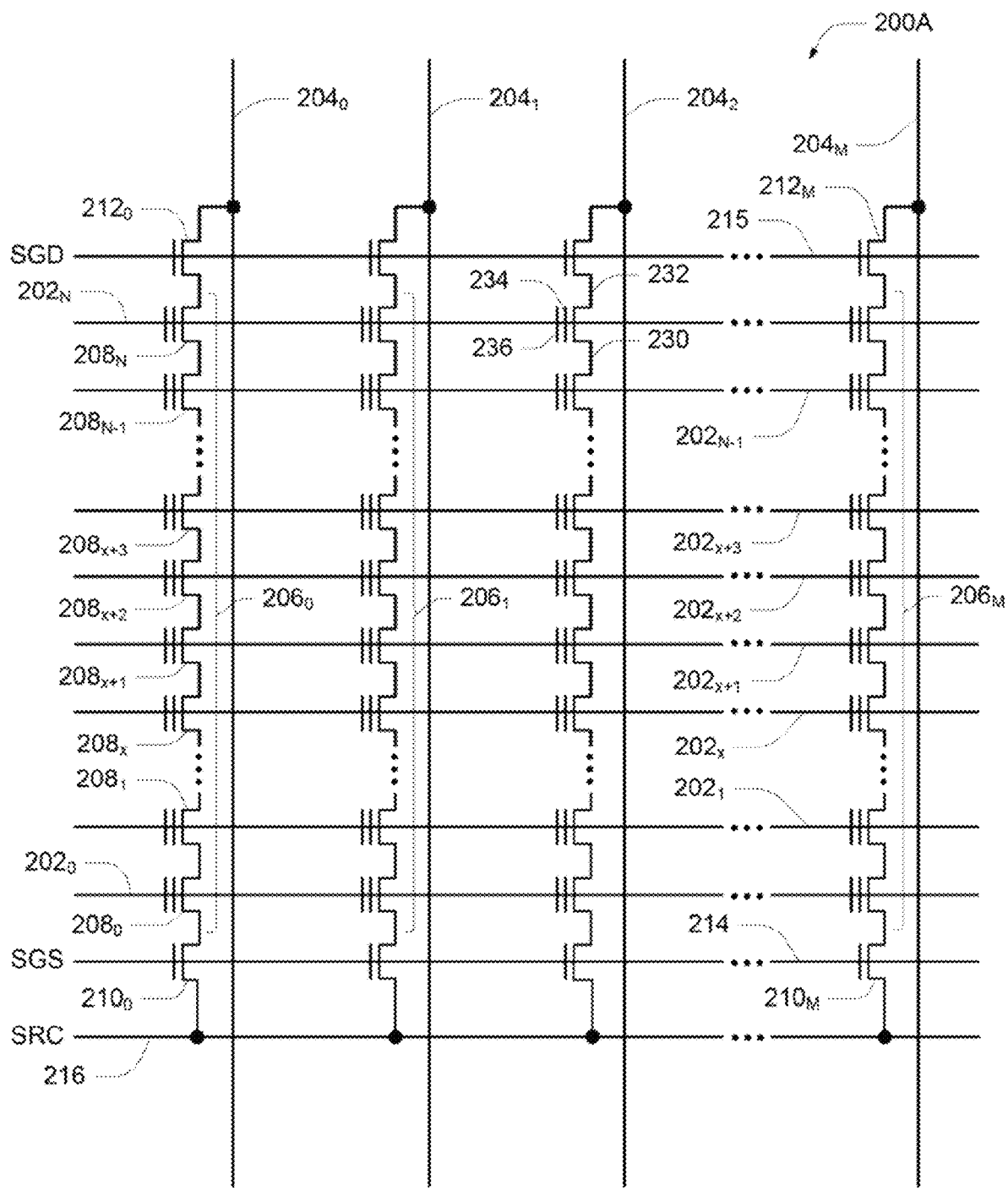
FIG. 2 is a schematic of portions of an array of memory cells as could be used in a memory of the type described with reference to FIG. 1B according to an embodiment.

FIG. 2 is a schematic of portions of an array 200A of memory cells as could be used in a memory of the type described with reference to FIG. 1B according to an embodiment, to include, for example, the SLC cache 145. Memory array 200A includes access lines, such as word lines $202_0$ to $202_N$, and data lines, such as bit lines $204_0$ to $204_M$. The word lines 202 can be connected to global access lines (e.g., global word lines), not shown in FIG. 2, in a many-to-one relationship. For some embodiments, memory array 200A can be formed over a semiconductor that, for example, can be conductively doped to have a conductivity type, such as a p-type conductivity, e.g., to form a p-well, or an n-type conductivity, e.g., to form an n-well.

The memory array 200A can be arranged in rows (each corresponding to a word line 202) and columns (each corresponding to a bit line 204). Each column can include a string of series-connected memory cells (e.g., non-volatile memory cells), such as one of NAND strings $206_0$ to $206_M$. Each NAND string 206 can be connected (e.g., selectively connected) to a common source (SRC) 216 and can include memory cells $208_0$ to $208_N$. The memory cells 208 can represent non-volatile memory cells for storage of data. The memory cells 208 of each NAND string 206 can be connected in series between a select gate 210 (e.g., a field-effect transistor), such as one of the select gates $210_0$ to $210_M$ (e.g., that can be source select transistors, commonly referred to as select gate source), and a select gate 212 (e.g., a field-effect transistor), such as one of the select gates $212_0$ to $212_M$ (e.g., that can be drain select transistors, commonly referred to as select gate drain). Select gates $210_0$ to $210_M$ can be commonly connected to a select line 214, such as a source select line (SGS), and select gates $212_0$ to $212_M$ can be commonly connected to a select line 215, such as a drain select line (SGD). Although depicted as traditional field-effect transistors, the select gates 210 and 212 can utilize a structure similar to (e.g., the same as) the memory cells 208. The select gates 210 and 212 can represent a number of select gates connected in series, with each select gate in series configured to receive a same or independent control signal.

A source of each select gate 210 can be connected to common source 216, or SRC. The drain of each select gate 210 can be connected to a memory cell $208_0$ of the corresponding NAND string 206. For example, the drain of select gate $210_0$ can be connected to memory cell $208_0$ of the corresponding NAND string $206_0$. Therefore, each select gate 210 can be configured to selectively connect a corresponding NAND string 206 to the common source 216. A control gate of each select gate 210 can be connected to the select line 214.

The drain of each select gate 212 can be connected to the bit line 204 for the corresponding NAND string 206. For example, the drain of select gate $212_0$ can be connected to the bit line $204_0$ for the corresponding NAND string $206_0$. The source of each select gate 212 can be connected to a memory cell $208_N$ of the corresponding NAND string 206. For example, the source of select gate $212_0$ can be connected to memory cell $208_N$ of the corresponding NAND string $206_0$. Therefore, each select gate 212 can be configured to selectively connect a corresponding NAND string 206 to the corresponding bit line 204. A control gate of each select gate 212 can be connected to select line 215.

The memory array 200A in FIG. 2 can be a quasi-two-dimensional memory array and can have a generally planar structure, e.g., where the common source 216, NAND strings 206 and bit lines 204 extend in substantially parallel planes. Alternatively, the memory array 200A in FIG. 2 can be a three-dimensional memory array, e.g., where NAND strings 206 can extend substantially perpendicular to a plane containing the common source 216 and to a plane containing the bit lines 204 that can be substantially parallel to the plane containing the common source 216.

Typical construction of memory cells 208 includes a data-storage structure 234 (e.g., a floating gate, charge trap, or the like) that can determine a data state of the memory cell (e.g., through changes in threshold voltage), and a control gate 236, as shown in FIG. 2. The data-storage structure 234 can include both conductive and dielectric structures while the control gate 236 is generally formed of one or more conductive materials. In some cases, memory cells 208 can further have a defined source/drain (e.g., source) 230 and a defined source/drain (e.g., drain) 232. The memory cells 208 have their control gates 236 connected to (and in some cases form) a word line 202.

A column of the memory cells 208 can be a NAND string 206 or a number of NAND strings 206 selectively connected to a given bit line 204. A row of the memory cells 208 can be memory cells 208 commonly connected to a given word line 202. A row of memory cells 208 can, but need not, include all the memory cells 208 commonly connected to a given word line 202. Rows of the memory cells 208 can often be divided into one or more groups of physical pages of memory cells 208, and physical pages of the memory cells 208 often include every other memory cell 208 commonly connected to a given word line 202. For example, the memory cells 208 commonly connected to word line $202_N$ and selectively connected to even bit lines 204 (e.g., bit lines $204_0$, $204_2$, $204_4$, etc.) can be one physical page of the memory cells 208 (e.g., even memory cells) while memory cells 208 commonly connected to word line $202_N$ and selectively connected to odd bit lines 204 (e.g., bit lines $204_1$, $204_3$, $204_5$, etc.) can be another physical page of the memory cells 208 (e.g., odd memory cells).

Although bit lines $204_3$-$204_5$ are not explicitly depicted in FIG. 2, it is apparent from the figure that the bit lines 204 of the array of memory cells 200A can be numbered consecutively from bit line $204_0$ to bit line $204_M$. Other groupings of the memory cells 208 commonly connected to a given word line 202 can also define a physical page of memory cells 208. For certain memory devices, all memory cells commonly connected to a given word line can be deemed a physical page of memory cells. The portion of a physical page of memory cells (which, in some embodiments, could still be the entire row) that is read during a single read operation or programmed during a single programming operation (e.g., an upper or lower page of memory cells) can be deemed a logical page of memory cells. A block of memory cells can include those memory cells that are configured to be erased together, such as all memory cells connected to word lines $202_0$-$202_N$ (e.g., all NAND strings 206 sharing common word lines 202). Unless expressly distinguished, a reference to a page of memory cells herein refers to the memory cells of a logical page of memory cells. Although the example of FIG. 2 is discussed in conjunction with NAND flash, the embodiments and concepts described herein are not limited to a particular array architecture or structure, and can include other structures (e.g., SONOS, phase change, ferroelectric, etc.) and other architectures (e.g., AND arrays, NOR arrays, etc.).

Figure 3:
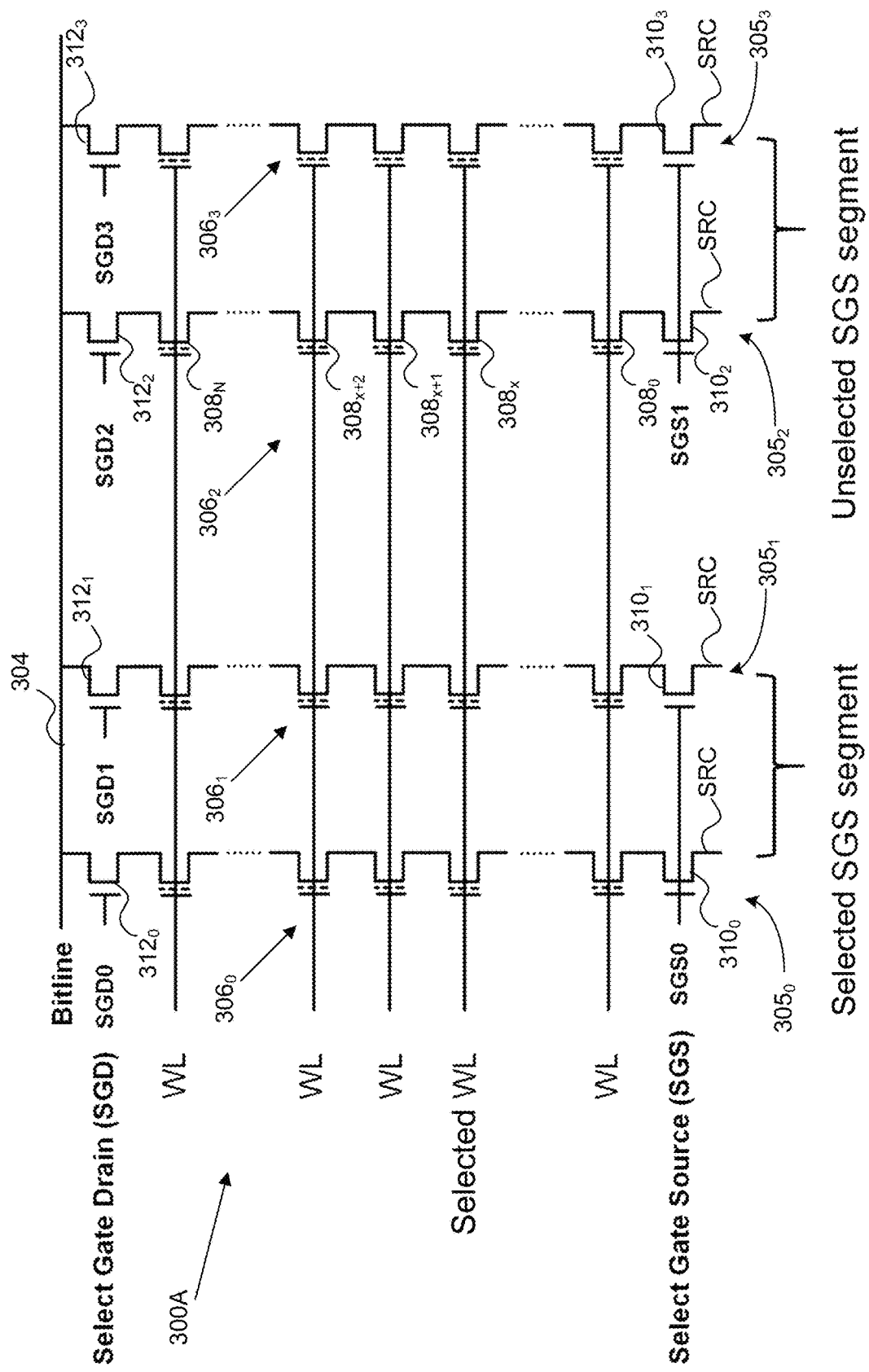
FIG. 3 is a schematic of two segments of an array of memory cells that include four sub-blocks according to at least some embodiments.

FIG. 3 is a schematic of two segments of an array of memory cells 300A that include four sub-blocks according to at least some embodiments. In some embodiments, the array of memory cells 300A is included in the SLC cache 145 of the memory device 130. For example, in segmented SGS (or SSGS) architecture, strings of memory cells can be grouped into sub-blocks, where there are two sub-blocks per SGS segment in some embodiments. A first (e.g., selected) SGS segment can include a first sub-block $305_0$ and a second sub-block $305_1$. A second (e.g., unselected) SGS segment can include a third sub-block $305_2$ and a fourth sub-block $305_3$. Other numbers of sub-blocks can be included in segments in other embodiments.

Specifically, in at least some embodiments, the array of memory cells 300A of FIG. 3 includes a bit line 304, where each sub-block is coupled to the bit line 304. The first sub-block $305_0$ (assumed to be the selected sub-block for ease of explanation) can include a first drain select (SGD) transistor $312_0$, a first source select (SGS) transistor $310_0$, and a first string of memory cells $306_0$ coupled therebetween. The second sub-block $305_1$ can include a second SGD transistor $312_1$, a second SGS transistor $310_1$, and a second string of memory cells $306_1$ coupled therebetween. The third sub-block $305_2$ can include a third SGD transistor $312_2$, a third SGS transistor $310_2$, and a third string of memory cells $306_2$ coupled therebetween. The fourth sub-block $305_3$ can include a fourth SGD transistor $312_3$, a fourth SGS transistor $310_3$, and a fourth string of memory cells $306_3$ coupled therebetween. By way of example, the third string of memory cells $306_2$, included in the unselected SGS segment, includes multiple memory cells $308_0$ . . . $308_N$. Each SGS transistor can be connected to a common source (SRC), e.g., a source voltage line, to provide voltage to the sources of the multiple memory cells $308_0$ . . . $308_N$. In some embodiments, the source voltage line includes a source plate that supplies the source voltage. In at least some embodiments, multiple wordlines (WLs) are coupled with gates of memory cells of each string of memory cells $306_0$ . . . $306_3$. Each string of memory cells includes a channel (not illustrated, which is coupled between the SGS transistor and SGD transistor of a sub-block.

In these embodiments, a first drain select gate line (SGD0) can be connected to the gate of the first SGD transistor $312_0$, a second drain select gate line (SGD1) can be connected to the gate of the second SGD transistor $312_1$, a third drain select gate line (SGD2) can be connected to the gate of the third SGD transistor $312_2$, and a fourth drain select gate line (SGD3) can be connected to the gate of the fourth SGD transistor $312_3$. Further, a first source select gate line (SGS0) can be connected to gates of the first and second SGS transistors $310_0$ and $310_1$. Additionally, a second source select gate line (SGS1) can be connected to gates of the third and fourth SGS transistors $310_2$ and $310_3$. Thus, the source voltage of each string of memory cells can be jointly controlled by the source select gate line (SGS0 or SGS1) for a separate segment, where the first segment is a combination of the first and second sub-blocks $305_0$ and $305_1$ and the second segment is a combination of the third and fourth sub-blocks $305_2$ and $305_3$.

Figure 4A:
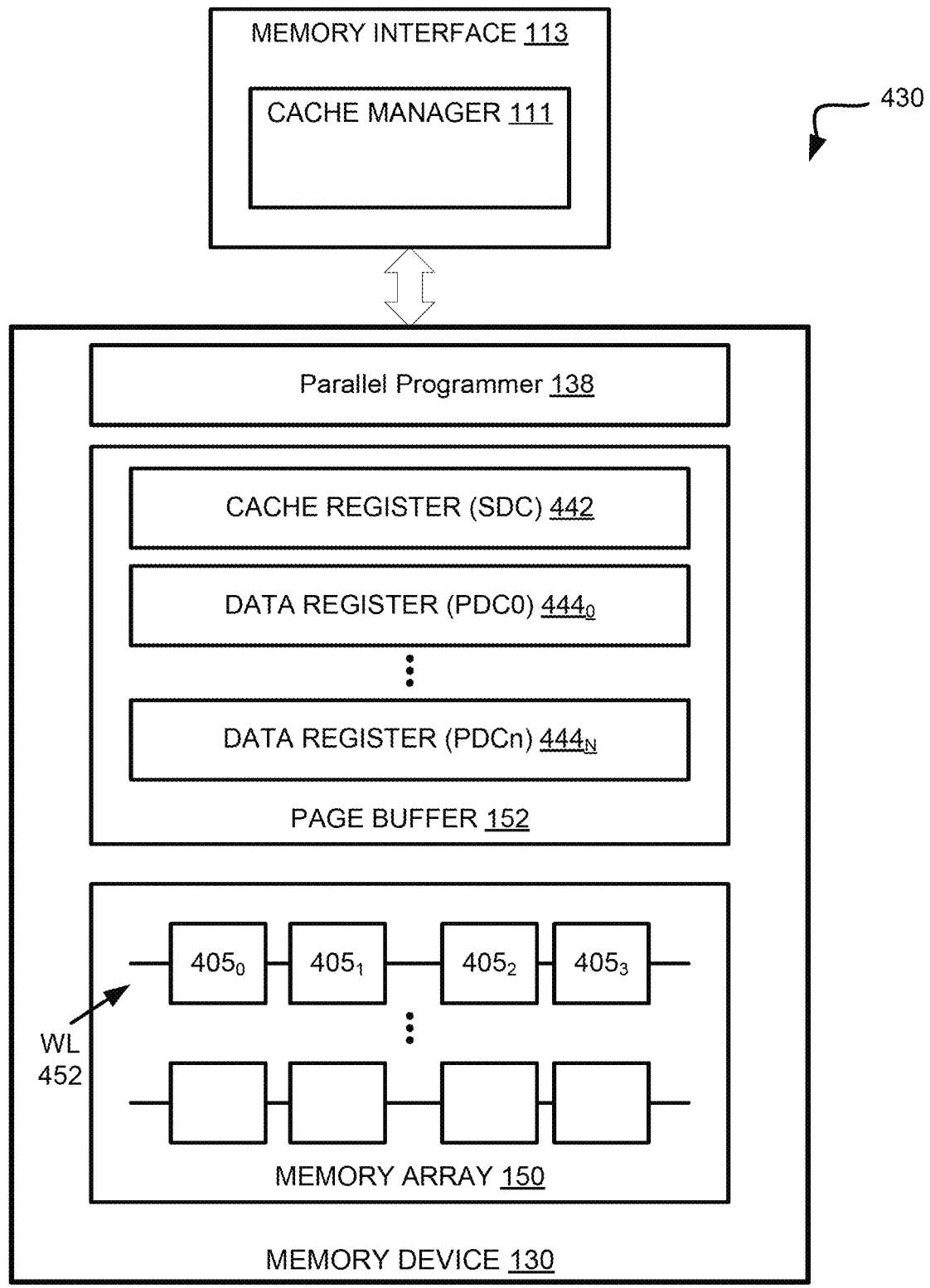
FIG. 4A is a block diagram illustrating a memory sub-system having a page buffer that includes registers from which to program a set of sub-blocks of a memory array that are configured as single-level cell (SLC) memory in accordance with some embodiments of the present disclosure.

FIG. 4A is a block diagram illustrating a memory subsystem 430 having a page buffer that includes registers from which to program a set of sub-blocks of a memory array that are configured as single-level cell (SLC) memory in accordance with some embodiments of the present disclosure. In one embodiment, the memory interface 113 is operatively coupled with memory device 130. In one embodiment, the memory device 130 includes the page buffer 152 and the memory array 150. The memory array 150 can include an array of memory cells formed at the intersections of wordlines, such as wordline 452, and bitlines, e.g., $204_M$ or 304 illustrated in FIG. 2 and FIG. 3, respectively. As discussed, these memory cells can be configured as SLC memory and thus be included within the SLC cache 145.

In one embodiment, the memory cells are grouped in to blocks, which can be further divided into sub-blocks, where a given wordline, such as wordline 452, is shared across a number of sub-blocks $405_0$, $405_1$, $405_2$, $405_3$, for example. In one embodiment, each sub-block corresponds to a separate plane in the memory array 150. The group of memory cells associated with a wordline within a sub-block is referred to as a physical page. Each physical page in one of the sub-blocks can be one of multiple page types. For example, a physical page formed from single level cells (SLCs) has a single page type referred to as a lower logical page (LP). Multi-level cell (MLC) physical page types can include LPs and upper logical pages (UPs), TLC physical page types are LPs, UPs, and extra logical pages (XPs), and QLC physical page types are LPs, UPs, XPs and top logical pages (TPs). In some embodiments, a physical page formed from memory cells of the QLC memory type can have a total of four logical pages, where each logical page can store data distinct from the data stored in the other logical pages associated with that physical page.

Depending on the programming scheme used, each logical page of a memory cell can be programmed in a separate programming pass, or multiple logical pages can be programmed together. For example, in a QLC physical page, the LP can be programmed on one pass, and the UP, XP and TP can be programmed on a second pass. Other programming schemes are possible. The page buffer 152 is a buffer used to temporarily store data being read from or written to the memory array 150 of the memory device 130, and can include a cache register 442 and one or more data registers $444_0$-$444_N$. For a read operation, the data is read from the memory array 150 into one of data registers $444_0$-$444_N$, and then into the cache register 442. The memory interface 113 can then read out the data from the cache register 442. For a program operation, the memory interface 113 writes the data to the cache register 442, which is then passed to one of the data registers $444_0$-$444_N$, and finally programmed to the memory array 250. If the program operation includes multiple pages (e.g., UP, XP, and TP), each page can have a dedicated data register to hold the corresponding page data. Functionality of the parallel programmer 138 introduced in FIG. 1, will be discussed in more detail with reference to FIG. 4B and FIGS. 5-7.

Figure 4B:
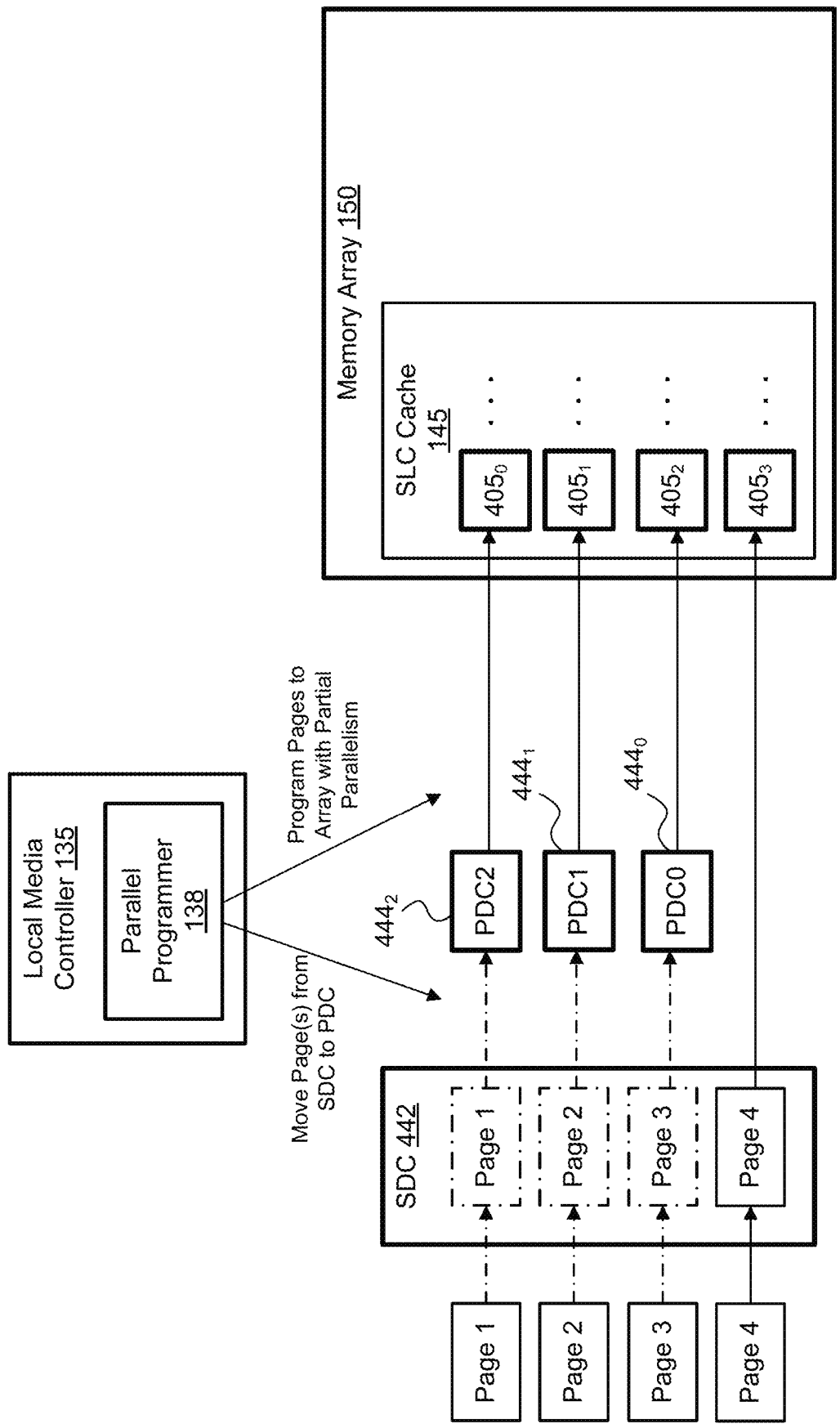
FIG. 4B is a block diagram illustrating hybrid parallel programming of SLC cells in accordance with some embodiments of the present disclosure.

FIG. 4B is a block diagram illustrating hybrid parallel programming of SLC cells in accordance with some embodiments of the present disclosure. In at least some embodiments, the parallel programmer 138, e.g., control logic of the local media controller 135, directs the hybrid parallel programming described herein. As discussed, the SLC cache 145 of the memory array 150 can include a number of sub-blocks, such as a first sub-block $405_0$, a second sub-block $405_1$, a third sub-block $405_2$, and a fourth sub-block $405_3$.

In these embodiments, the local media controller 135 sequentially stores (or buffers) multiple (e.g., four) pages of the SLC data into the cache register 442. The dotted-dashed lines are to indicate each page (e.g., page 1, page 2, page 3, page 4) is sequentially stored in the cache register 442, one at a time. In some embodiments, the parallel programmer 138 also directs this buffering step. In at least some embodiments, the parallel programmer 138 sequentially causes the first page, the second page, and the third page of the four pages to be sequentially moved from the cache register 442 to respective ones of the data registers $444_0$-$444_N$ of the page buffer 152. For example, in at least one embodiment, the control logic moves page 3 from the cache register 442 to a first data register $444_0$, followed by moving page 2 from the cache register 442 to a second data register $444_1$, followed by moving page 1 from the cache register 442 to a third data register $444_2$. In these embodiments, the parallel programmer 138 further causes a fourth page (page 4) of the four pages to be retained in the cache register 442.

In various embodiments, once the data registers $444_0$-$444_N$ contain one or more of the three pages, the parallel programmer 138 can cause the SLC data of the four pages to be programmed to a respective sub-block of the set of sub-blocks in the SLC cache 145. For example, the first page in the third data register $444_2$ can be programmed to the first sub-block $405_0$, the second page in the second data register $444_1$ can be programmed to the second sub-block $405_1$, the third page in the first data register $444_0$ can be programmed to the third sub-block $405_2$, and the fourth page maintained in the cache register 442 can programmed to the fourth sub-block $405_3$.

In at least some embodiments, the memory device 130 is configured to perform cache programming, e.g., using a program page cache command (80h-15h). Cache programming enables the host system 120 to input data to the cache register 442 that the local media controller 135 can then cause to be moved to the data registers $444_0$-$444_N$ followed by causing the data in the data registers $444_0$-$444_N$ to be programmed to the memory array 150. The latter programming step can include programming the data to a specified block and page address in the memory array 150 of a selected die. In this way, the host system 120 gets direct access to the SLC cache 145 for host system purposes.

In cache programming embodiments, only a single program page cache operation can be entered during cache busy time (RDY=1 and ARDY=0). After the single program page cache operation, data is not transferred from the cache register 442 into the data registers $444_0$-$444_N$ until the cache program operation in progress is completed (RDY=1 and ARDY=1). After the data is copied to the data registers $444_0$-$444_N$, the cache register 442 is available for additional program page cache commands. When the die is ready, the host system 120 checks a FAIL bit to verify the operation has completed successfully.

In at least some cache programming embodiments, only the first data register $444_0$ is available to which to move data buffered in the cache register 442, e.g., so that the other data registers $444_1$-$444_N$ can continue to be used by the local media controller 135 for non-cache programming by the memory device 130. Accordingly, the embodiments discussed above with reference to hybrid parallel programming four pages at a time is reduced to hybrid parallel programming two pages, e.g., page 3 and page 4 illustrated within the cache register 442, to two sub-blocks of the SLC cache 145. Thus, the operations described above and that are described in more detail with reference to FIG. 5 relate to two pages of SLC data.

Figure 5:
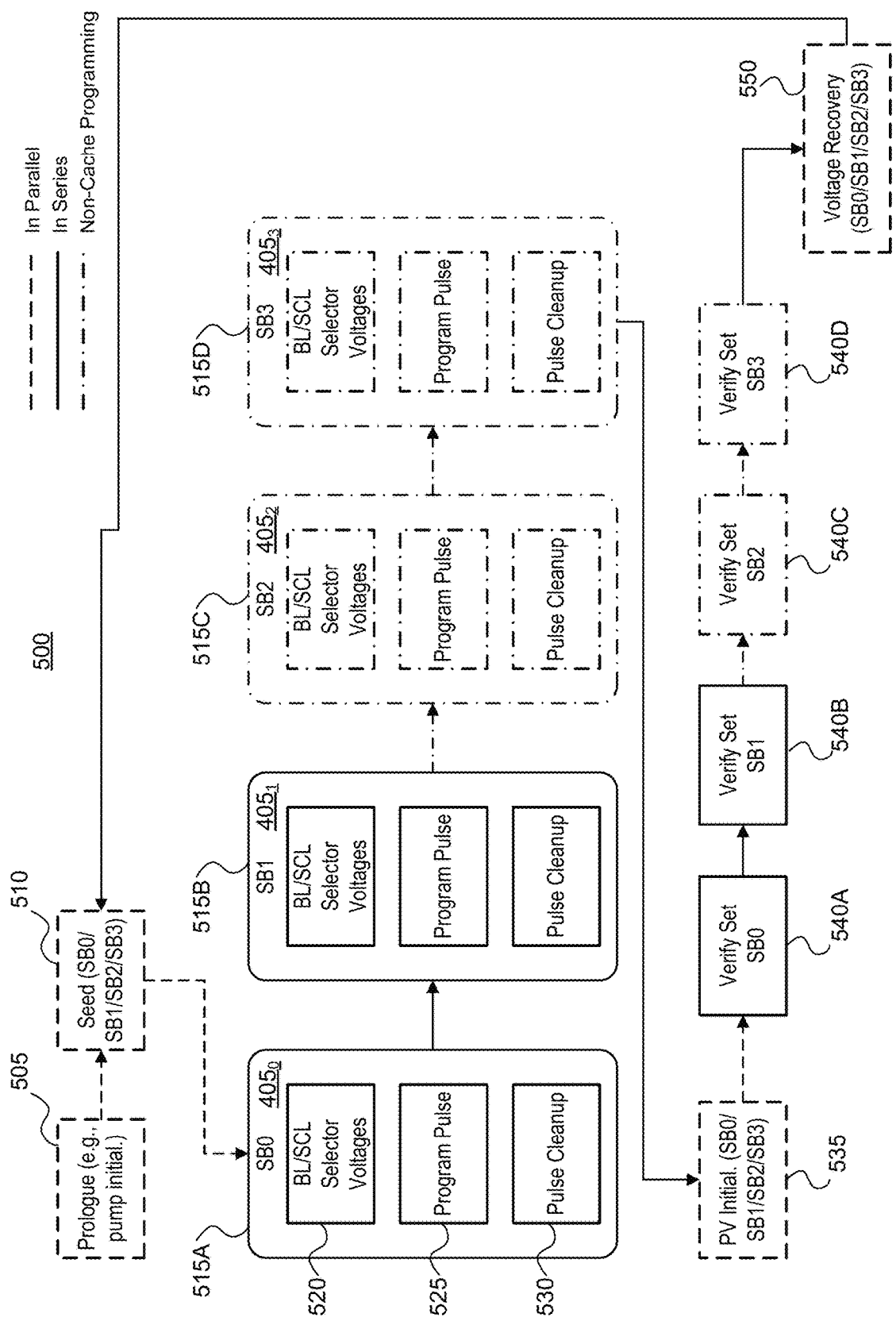
FIG. 5 is a flow diagram of an example method of hybrid parallel programming of SLC memory in accordance with some embodiments of the present disclosure.

FIG. 5 is a flow diagram of an example method 500 of hybrid parallel programming of SLC memory in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the parallel programmer 138 of FIG. 1-FIG. 3. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As illustrated in the legend of FIG. 5, operations performed in parallel are indicated with a dashed line, operation performed in series are indicated with a solid line, and optional operations (when performing non-cache programming) are indicated in dashed-dot lines, which are also performed serially. Thus, a sub-set of operations, including operations 505, 510, 535, and 550, can be performed in parallel when programming multiple pages of SLC data to a set of sub-blocks of the SLC cache 145. Further, operations 515C, 515D, 540C, and 540D are not performed when performing cache programming, and the remainder of the operations thus apply only to two sub-blocks. The ability to perform the sub-set of the operations in parallel leverages performance of operations across the programming of multiple pages, e.g., at least two pages of SLC data for cache programming and four pages of SLC data for non-cache programming. For non-cache programming, this results in performance improvement in reducing programming time (tProg) by at least a third over normal programming time where each page of data is individually programmed with no parallelism.

At operation 505, a prologue is performed. More specifically, the processing logic performs a prologue operation to begin programming operations, to include causing charge pump and other analog hardware initialization to be performed for the set of sub-blocks. Charge pumps will enable ramping bitlines, wordlines, and source voltage lines to target voltages useable for programming.

At operation 510, a seed operation is performed. For example, the processing device performs the seed operation for the set of sub-blocks in the memory array 150. This seed operation includes, for example, selecting one or more bitlines that are not to be involved with programming, e.g., are in unselected sub-blocks.

At operations 515A, 515B, 515C, and 515D, programming of individual sub-blocks is performed. More specifically, the processing logic serially programs a first sub-block $405_0$ (SB0) with a first page from the page buffer 152, a second sub-block $405_1$ (SB1) with a second page from the page buffer 152, a third sub-block $405_2$ (SB2) with a third page from the page buffer 152, and a fourth sub-block $405_3$ (SB3) with a fourth page from the page buffer 152.

Because the programming of a sub-block is replicated four times in series, only a single set of programming operations for the actual writing to the SLC cache 145 is described. For example, at operation 520, selected bitline and source voltage lines (e.g., SRCs) are prepared. For example, the processing logic causes a selected bitline and a selected source voltage line to be charged to target voltages in preparation for programming a sub-block coupled between the selected bitline and the selected source voltage line. The processing logic also causes voltages to a select gate line and a select source line to ramp to predetermined voltages, respectively, to turn on SGD transistors and SGS transistors.

At operation 525, a program pulse is activated. For example, the processing logic causes unselected wordlines of the sub-block to be ramped to a pass voltage and causes a selected wordline of the sub-block to be charged to a program voltage, e.g., by providing a program pulse.

At operation 530, a pulse cleanup is performed. For example, the processing logic causes the memory array to exit high-voltage programming phase, e.g., by discharging the wordlines of the previously applied voltages. In this way, the memory array is prepared to apply correct verify voltages during perform program verify operations. As a reminder, each of operations 520, 525, and 530 are repeated for each additional sub-block of the SLC cache 145 that is programmed.

At operation 535, a program verify initialization is performed. For example, the processing logic causes a program verify initialization to be performed for the set of sub-blocks. Such program verify initialization can include determining which memory cells are fully programmed and which need at least one more program pulse.

At operations 540A, 540B, 540C, and 540D, a program verify sense operation is performed on the set of sub-blocks. For example, the processing logic causes a program verify sense operation to be performed on one or more memory cells of the sub-block to which the selected wordline is connected for each of these operations. More specifically, at operation 540A, the processing logic causes the sense operation to be performed on the first sub-block $405_0$ (SB0). At operation 540B, the processing logic causes the sense operation to be performed on the second sub-block $405_1$ (SB1). At operation 540C, the processing logic causes the sense operation to be performed on the third sub-block $405_2$ (SB2). At operation 540D, the processing logic causes the sense operation to be performed on the fourth sub-block $405_3$ (SB3).

At operation 550, voltage recovery is performed. For example, the processing logic causes the bitlines and the wordlines to be discharged during a voltage recovery phase, such that the memory array is prepared to handle another memory operation. After the voltage recovery phase, the method 500 can loop back to operation 510 to continue with performing additional programming of additional sets of pages of SLC data.

Figure 6:
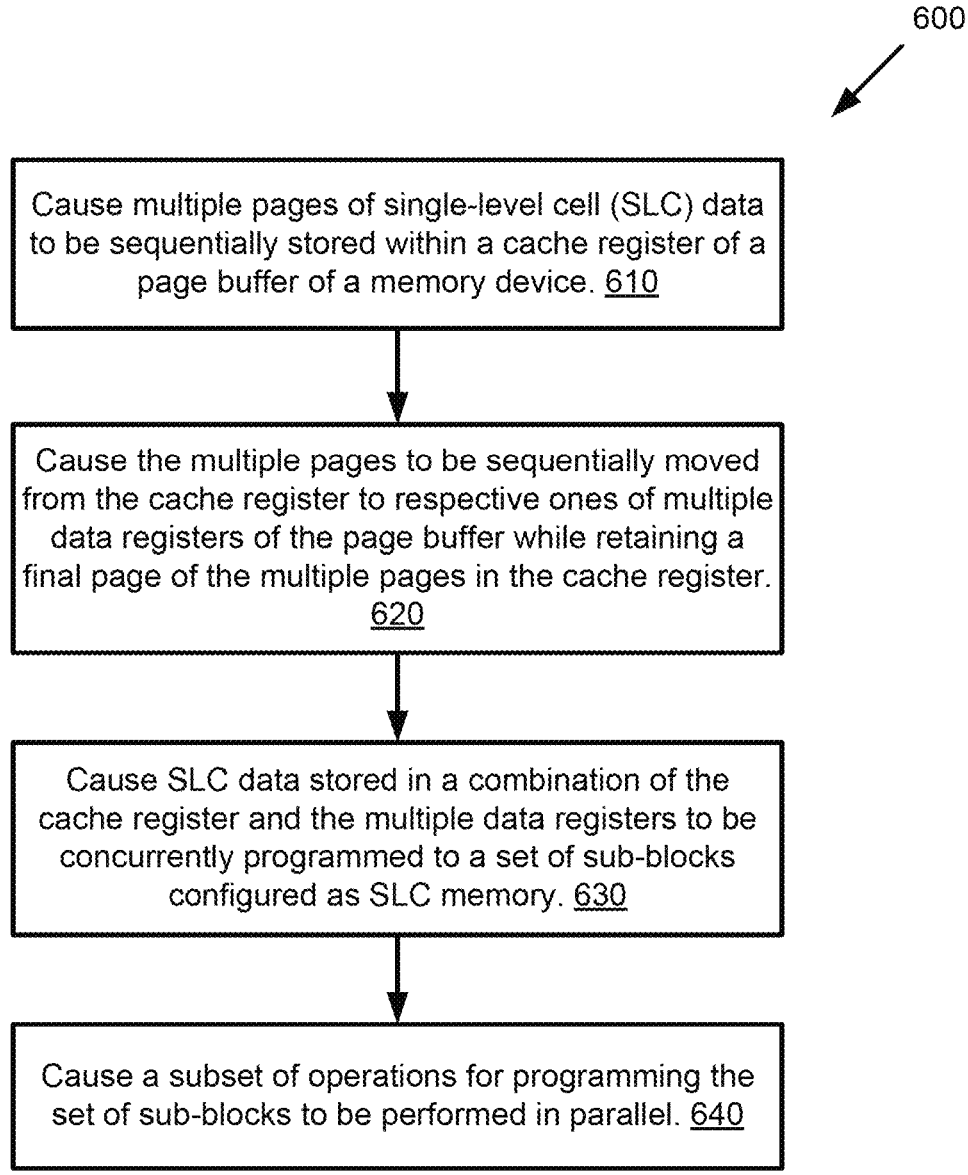
FIG. 6 is a flow diagram of an example method of hybrid parallel programming of SLC memory in accordance with some embodiments of the present disclosure.

FIG. 6 is a flow diagram of an example method 600 of hybrid parallel programming of SLC memory in accordance with some embodiments of the present disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by parallel programmer 138 of FIG. 1-FIG. 3. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 610, SLC data is buffered in cache register. For example, the processing logic causes multiple pages of single-level cell (SLC) data to be sequentially stored within a cache register of the page buffer, e.g., one page at a time.

At operation 620, some SLC data is moved to data register(s). For example, the processing logic causes the multiple pages to be sequentially moved from the cache register to respective ones of multiple data registers of the page buffer while retaining a final page of the multiple pages in the cache register. How individual pages of data end up buffered across the cache register and the multiple data registers is discussed in detail with reference to FIG. 4B.

At operation 630, the SLC data is programmed. For example, the processing logic causes the multiple pages of the SLC data stored in a combination of the cache register and the multiple data registers to be concurrently programmed to a set of sub-blocks that include memory cells configured as SLC memory. A respective page of the multiple pages is to be programmed to each respective sub-block of the set of sub-blocks. The set of sub-blocks can be located in a memory array within the SLC cache 145 of the memory device 130 (FIG. 4B).

At operation 630, the programming is performed, in part, in parallel. For example, the processing logic causes a subset of operations for programming the set of sub-blocks to be performed in parallel. As discussed with reference to FIG. 5, the subset of such programming operations can include causing charge pump initialization to be performed for the set of sub-blocks; selecting one or more bitlines not to be involved with programming; causing a program verify initialization to be performed for the set of sub-blocks; and causing bitlines and wordlines to be discharged during a voltage recovery phase.

Figure 7:
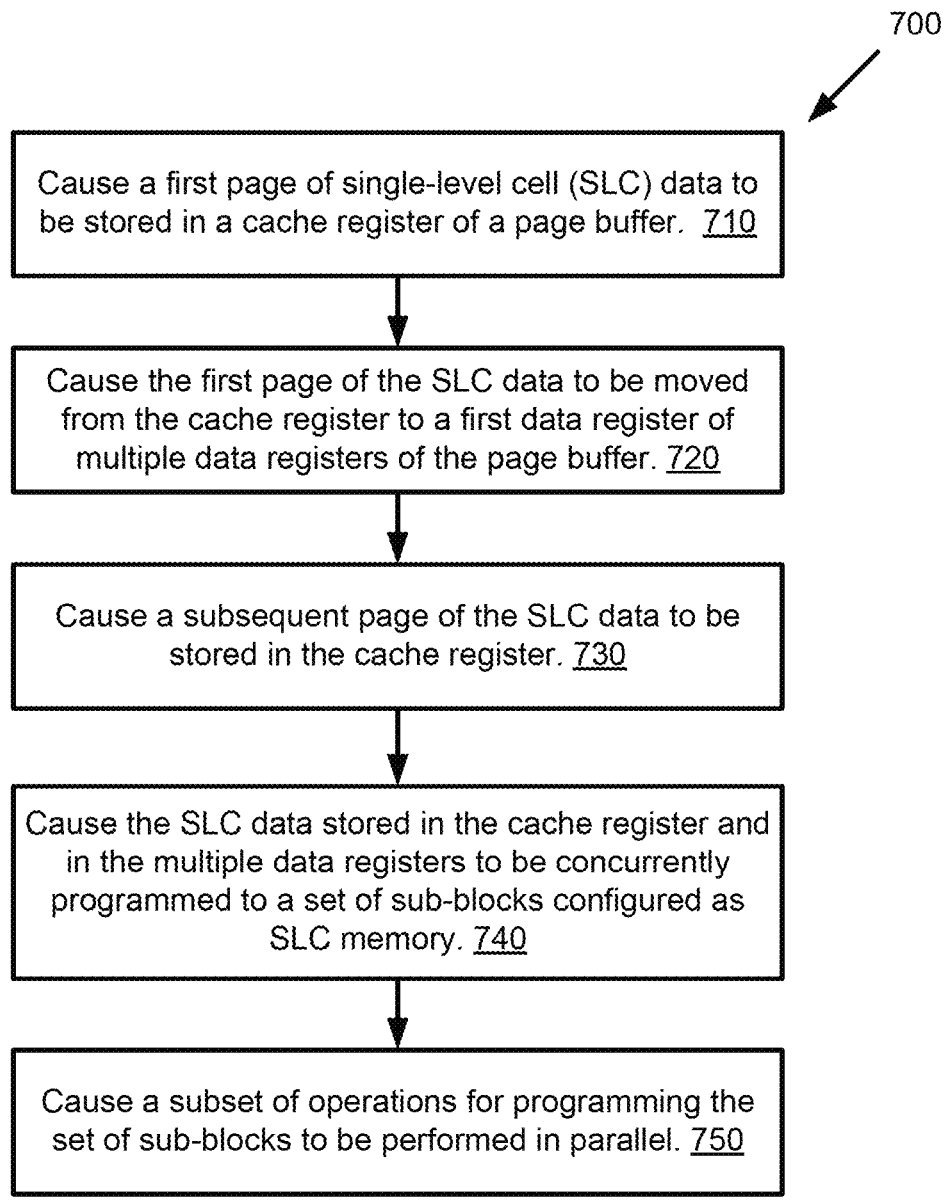
FIG. 7 is a flow diagram of an example method of hybrid parallel programming of SLC memory in accordance with some embodiments of the present disclosure.

FIG. 7 is a flow diagram of an example method 700 of hybrid parallel programming of SLC memory in accordance with some embodiments of the present disclosure. The method 700 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 700 is performed by the parallel programmer 138 of FIG. 1-FIG. 3. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 710, SLC data is buffered. For example, the processing logic causes a first page of single-level cell (SLC) data to be stored in a cache register of the page buffer.

At operation 720, the SLC data is moved within the page buffer. For example, the processing logic causes the first page of the SLC data to be moved from the cache register to a first data register of multiple data registers of the page buffer.

At operation 730, more SLC data is buffered. For example, the processing logic causes a subsequent page of the SLC data to be stored in the cache register. How individual pages of data end up buffered across the cache register and the one or more data registers is discussed in detail with reference to FIG. 4B.

At operation 740, the SLC data is programmed. For example, the processing logic causes the SLC data stored in the cache register and in the multiple data registers to be concurrently programmed to a set of sub-blocks that include memory cells configured as SLC memory. For example, the first page is programmed to a first sub-block and the subsequent page is programmed to a subsequent sub-block of the set of sub-blocks. A respective page of the multiple pages are to be programmed to each respective sub-block of the set of sub-blocks, as discussed with reference to FIG. 4B.

At operation 750, the programming is performed, in part, in parallel. For example, the processing logic causes a subset of operations for programming the set of sub-blocks to be performed in parallel. As discussed with reference to FIG. 5, the subset of such programming operations can include causing charge pump initialization to be performed for the set of sub-blocks; selecting one or more bitlines not to be involved with programming; causing a program verify initialization to be performed for the set of sub-blocks; and causing bitlines and wordlines to be discharged during a voltage recovery phase.

In at least one cache programming embodiment, the set of sub-blocks include two sub-blocks of SLC cache, the subsequent page is a second page of two pages SLC data, and causing the SLC data stored in the cache register and in the multiple data registers to be concurrently programmed to the set of sub-blocks involves cache programming.

In at least one non-cache programming embodiment, the set of sub-blocks include four sub-blocks of SLC cache, the SLC data include four pages, and the subsequent page is a fourth page of the four pages. In these embodiments, operations 710 and 720 can further include the processing logic causing a second page of the SLC data to be stored in the cache register; causing the second page of the SLC data to be moved from the cache register to a second data register of the multiple data registers; causing a third page of the SLC data to be stored in the cache register; and causing the third page of the SLC data to be moved from the cache register to a third data register of the multiple data registers. In the at least one non-cache programming embodiment, operation 730 can further include the processing logic causing the second page to be programmed to a second sub-block of the set of sub-blocks and causing the third page to be programmed to a third sub-block of the set of sub-blocks. In this embodiment, the subsequent sub-block is a fourth sub-block of the set of sub-blocks.

Figure 8:
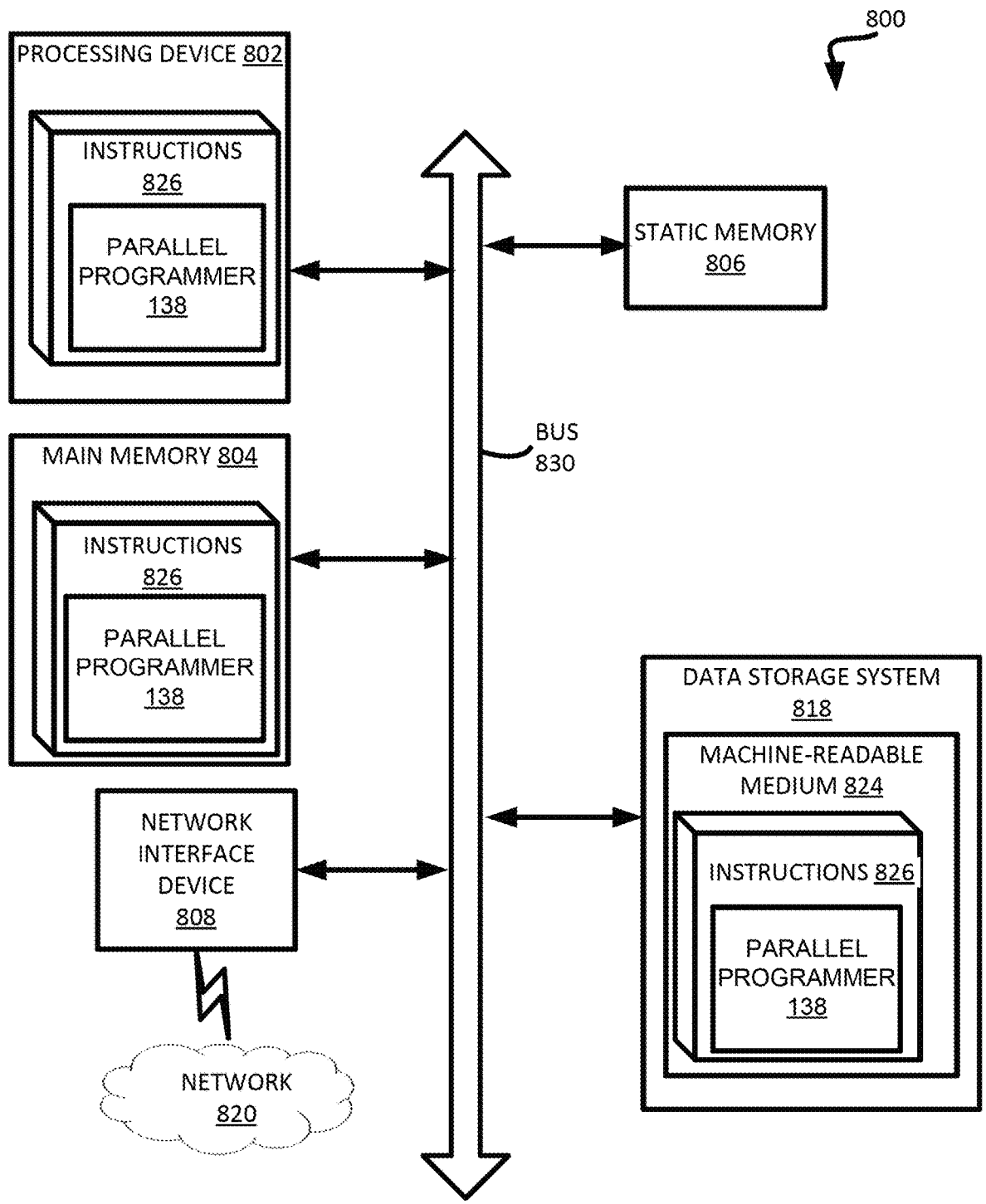
FIG. 8 is a block diagram of an example computer system in which embodiments of the present disclosure can operate.

FIG. 8 illustrates an example machine of a computer system 800 within which a set of instructions, for causing the machine to perform any one or more of the methodologies discussed herein, can be executed. In some embodiments, the computer system 800 can correspond to a host system (e.g., the host system 120 of FIG. 1A) that includes, is coupled to, or utilizes a memory sub-system (e.g., the memory sub-system 110 of FIG. 1A) or can be used to perform the operations of a controller (e.g., to execute an operating system to perform operations corresponding to cache manager 111 and/or parallel programmer 138 of FIG. 1A). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a data storage system 818, which communicate with each other via a bus 830.

Processing device 802 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 can also be one or more special-purpose processing devices such as an application specific integrated circuit (ASIC), a field programmable gate array (FPGA), a digital signal processor (DSP), network processor, or the like. The processing device 802 is configured to execute instructions 826 for performing the operations and steps discussed herein. The computer system 800 can further include a network interface device 808 to communicate over the network 820.

The data storage system 818 can include a machine-readable storage medium 824 (also known as a computer-readable medium, such as a non-transitory computer-readable medium) on which is stored one or more sets of instructions 826 or software embodying any one or more of the methodologies or functions described herein. The instructions 826 can also reside, completely or at least partially, within the main memory 804 and/or within the processing device 802 during execution thereof by the computer system 800, the main memory 804 and the processing device 802 also constituting machine-readable storage media. The machine-readable storage medium 824, data storage system 818, and/or main memory 804 can correspond to the memory sub-system 110 of FIG. 1A.

In one embodiment, the instructions 826 include instructions to implement functionality corresponding to cache manager 111 and/or parallel programmer 138 of FIG. 1A). While the machine-readable storage medium 824 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium"

shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
a page buffer comprising multiple registers;
a memory array, configured as single-level cell (SLC) memory, comprising a set of sub-blocks coupled with the page buffer; and
control logic operatively coupled with the page buffer, the control logic to perform operations comprising:
causing a first page of SLC data to be stored in a first register of the multiple registers;
causing a subsequent page of the SLC data to be stored in a subsequent register of the multiple registers;
causing the subsequent page and the first page of the SLC data, stored in the multiple registers, to be concurrently programmed to the set of sub-blocks, wherein the first page of SLC data is stored to a first sub-block of the set of sub-blocks and the subsequent page of the SLC data is stored to a second sub-block of the set of sub-blocks; and
causing at least some of the operations for programming the first page and the subsequent page to the set of sub-blocks to be performed in parallel, wherein the at least some of the operations comprise causing a program verify initialization to be performed on the set of sub-blocks.

2. The memory device of claim 1, wherein the first page of SLC data is stored to a first physical page of a first sub-block of the set of sub-blocks, the subsequent page of the SLC data is stored to a second physical page of a second sub-block of the set of sub-blocks, and wherein each of the first physical page and the second physical page is one of a lower logical page (LP), a upper logical page (UP), or an extra logical page (XP).

3. The memory device of claim 1, wherein the multiple registers comprises a cache register and one or more data registers, and wherein the first page and the subsequent page of the SLC data are programmed to different sub-blocks of the set of sub-blocks.

4. The memory device of claim 3, wherein the first page of SLC data is stored in the one or more data registers and the subsequent page of the SLC data is stored in the cache register, wherein the operations further comprise:
causing a second page of the SLC data to be stored in the cache register;
causing the second page of the SLC data to be moved from the cache register to a second data register of the one or more data registers;
causing a third page of the SLC data to be stored in the cache register; and
causing the third page of the SLC data to be moved from the cache register to a third data register of the one or more data registers.

5. The memory device of claim 4, wherein causing the subsequent page and the first page of the SLC data to be concurrently programmed to the set of sub-blocks further comprises concurrently:
causing the first page to be programmed to a first sub-block of the set of sub-blocks;

causing the second page to be programmed to a second sub-block of the set of sub-blocks;
causing the third page to be programmed to a third sub-block of the set of sub-blocks; and
causing the subsequent page to be programmed to a fourth sub-block of the set of sub-blocks.

6. The memory device of claim 1, wherein the set of sub-blocks comprise two sub-blocks of SLC cache, the subsequent page is a second page of two pages of SLC data, and wherein causing the subsequent page and the first page of the SLC data to be concurrently programmed to the set of sub-blocks comprises cache programming.

7. The memory device of claim 1, wherein the operations for programming to be performed in parallel comprise:
causing charge pump initialization to be performed for the set of sub-blocks; and
causing bitlines and wordlines for the set of sub-blocks to be discharged during a voltage recovery phase.

8. The memory device of claim 7, wherein the operations for programming to be performed in parallel comprise selecting one or more bitlines not to be involved with programming.

9. The memory device of claim 7, wherein the operations for programming serially comprise, for each sub-block of the set of sub-blocks:
causing a selected bitline and a selected source voltage line to be charged to target voltages in preparation for programming a sub-block coupled between the selected bitline and the selected source voltage line; and
causing voltages to a select gate line and a select source line to ramp to predetermined voltages, respectively.

10. The memory device of claim 7, wherein the operations for programming serially comprise, for each sub-block of the set of sub-blocks:
causing unselected wordlines of the sub-block to be ramped to a pass voltage;
causing a selected wordline of the sub-block to be charged to a program voltage; and
causing a program verify sense operation to be performed on one or more memory cells of the sub-block to which the selected wordline is connected.

11. A memory device comprising:
a page buffer comprising a cache register and at least one data register;
a memory array, configured as single-level cell (SLC) memory, comprising a set of sub-blocks coupled with the page buffer; and
control logic operatively coupled with the page buffer, the control logic to perform operations comprising:
causing a first page of SLC data stored in the at least one data register to be programmed to a first sub-block of the set of sub-blocks; and
causing a subsequent page of the SLC data stored in the cache register to be programmed to a second sub-block of the set of sub-blocks concurrently with programming the first page of SLC data to the first sub-block; and
wherein at least some of the operations for programming the first page and the subsequent page of the SLC data to the set of sub-blocks are performed in parallel.

12. The memory device of claim 11, wherein the operations further comprise:
receiving, from a host system, a program page cache command comprising the first page of SLC data and a first page address, wherein the host system has stored the first page of SLC data in the cache register;
moving the first page of SLC data from the cache register to the at least one data register;
causing a subsequent page of the SLC data received from the host system with a second page address to be stored in the cache register; and
concurrently causing:
the first page of SLC data to be programmed from the at least one data register to the first page address at a first sub-block of the set of sub-blocks; and
the subsequent page of the SLC data to be programmed from the cache register to the second page address of a second sub-block of the set of sub-blocks.

13. The memory device of claim 11, wherein the first sub-block and the second sub-block comprise two sub-blocks of SLC cache, the subsequent page is a second page of two pages of SLC data, and wherein causing the subsequent page and the first page of the SLC data to be concurrently programmed to the set of sub-blocks comprises cache programming.

14. The memory device of claim 11, wherein the operations for programming the first page and the subsequent page in parallel comprise:
causing analog hardware initialization to be performed for each of the first sub-block and the second sub-block; and
selecting one or more bitlines for each of the first sub-block and the second sub-block not to be involved with programming.

15. The memory device of claim 11, wherein the operations for programming the first page and the subsequent page in parallel comprise:
causing a program verify initialization to be performed for each of the first sub-block and the second sub-block; and
causing bitlines and wordlines to be discharged for each of the first sub-block and the second sub-block during a voltage recovery phase.

16. The memory device of claim 11, wherein, for each of the first sub-block and the second sub-block, the operations further comprise serially:
causing a selected bitline and a selected source voltage line to be charged to target voltages in preparation for programming the sub-block coupled between the selected bitline and the selected source voltage line; and
causing voltages to a select gate line and a select source line to ramp to predetermined voltages, respectively.

17. The memory device of claim 16, wherein, for each of the first sub-block and the second sub-block, the operations further comprise serially:
causing unselected wordlines of the sub-block to be ramped to a pass voltage;
causing a selected wordline of the sub-block to be charged to a program voltage; and
causing a program verify sense operation to be performed on one or more memory cells of the sub-block to which the selected wordline is connected.

18. A memory device comprising:
a page buffer comprising a cache register and at least one data register;
a memory array, configured as single-level cell (SLC) memory, comprising a set of sub-blocks coupled with the page buffer; and
control logic operatively coupled with the page buffer, the control logic to perform operations comprising:
receive, from a host system, a program page cache command comprising a first page of SLC data and a first page address, wherein the host system has stored the first page of SLC data in the cache register;

moving the first page of SLC data from the cache register to the at least one data register;

causing a subsequent page of the SLC data received from the host system with a second page address to be stored in the cache register; and concurrently causing:

the first page of SLC data to be programmed from the at least one data register to the first page address at a first sub-block of the set of sub-blocks; and the subsequent page of the SLC data to be programmed from the cache register to the second page address of a second sub-block of the set of sub-blocks;

wherein at least some of the operations for programming the first page and the subsequent page of the SLC data to the set of sub-blocks are to be performed in parallel.

19. The memory device of claim 18, wherein the first page of SLC data is stored to a first physical page of the first sub-block, the subsequent page of the SLC data is stored to a second physical page of the second sub-block, and wherein each of the first physical page and the second physical page is configured as an SLC physical page.

20. The memory device of claim 18, wherein the first sub-block and the second sub-block comprise two sub-blocks of SLC cache, the subsequent page is a second page of two pages of SLC data, and wherein causing the subsequent page and the first page of the SLC data to be concurrently programmed to the set of sub-blocks comprises cache programming.

* * * * *